US009052074B2

(12) United States Patent
Katzler et al.

(10) Patent No.: US 9,052,074 B2
(45) Date of Patent: Jun. 9, 2015

(54) METHOD OF PRODUCING A LIGHTING DEVICE, AND A CORRESPONDING LIGHTING DEVICE

(75) Inventors: Gerald Katzler, Erding (DE); Alessandro Scordino, Dolo (IT); Franco Zanon, Cassola (IT)

(73) Assignee: Osram GmbH, Munich (DE)

( * ) Notice: Subject to any disclaimer, the term of this patent is extended or adjusted under 35 U.S.C. 154(b) by 275 days.

(21) Appl. No.: 13/591,249

(22) Filed: Aug. 22, 2012

(65) Prior Publication Data

US 2013/0051022 A1 Feb. 28, 2013

(30) Foreign Application Priority Data

Aug. 24, 2011 (IT) .............................. TO2011A0774

(51) Int. Cl.
*F21S 4/00* (2006.01)
*F21V 23/06* (2006.01)
(Continued)

(52) U.S. Cl.
CPC ............ *F21S 4/003* (2013.01); *Y10T 29/49002* (2013.01); *H01R 13/10* (2013.01); *F21V 23/06* (2013.01); *H01R 12/52* (2013.01); *H01R 12/718* (2013.01); *H01R 13/11* (2013.01);
(Continued)

(58) Field of Classification Search
CPC .......... F21Y 2101/02; F21Y 2103/003; F21V 31/005; F21V 15/013; F21V 23/009; F21V 21/025; F21S 2/005; F21S 4/008; F21S 4/003; F21S 4/006; F21S 4/005; H01R 12/718; H01R 13/10; H01R 13/11; H01R 13/112; H01R 12/52; H05K 3/284; H05K 3/403; H05K 2201/037; H05K 2201/1031; H05K 2201/10106; H05K 2203/0228; H05K 2203/1316; Y10T 29/49002
USPC ............... 362/219, 249.02–249.06; 29/426.4, 29/592.1; 439/56, 495
See application file for complete search history.

(56) References Cited

U.S. PATENT DOCUMENTS 4,173,035 A * 10/1979 Hoyt ........................ 362/249.04
6,881,906 B2 4/2005 Birgel et al.
(Continued)

FOREIGN PATENT DOCUMENTS

DE 102009008095 A1 8/2010
DE 102009020851 A1 * 11/2010
(Continued)

OTHER PUBLICATIONS

English abstract of DE 102009008095 A1.

*Primary Examiner* — Alan Cariaso

(57) ABSTRACT

Provide a plurality of lighting modules. Connect together a plurality of the lighting modules for forming a series of lighting modules. Cut the series of lighting modules into lighting devices having a lighting module. Interconnection elements of the last lighting module of each lighting device are cut along their transverse axes. Each lighting module includes a first set of contacts placed at a first end of said lighting module and a second set of contacts placed in corresponding positions at a second end of said lighting module. Each lighting module is connected to the next lighting module by means of interconnection elements which connect the first set of contacts of each lighting module to the second set of contacts of the next lighting module. Interconnection elements include a base plate and a hollow portion in order to form female connectors when said interconnection elements are cut along their transverse axis.

8 Claims, 5 Drawing Sheets

(51) Int. Cl.

| | |
|---|---|
| ***H01R 13/10*** | (2006.01) |
| ***H05K 3/28*** | (2006.01) |
| ***H05K 3/40*** | (2006.01) |
| ***H01R 12/71*** | (2011.01) |
| ***H01R 13/11*** | (2006.01) |
| *H01R 12/52* | (2011.01) |
| *F21Y 101/02* | (2006.01) |

(52) U.S. Cl.
CPC ............... *H05K 3/284* (2013.01); *H05K 3/403* (2013.01); *F21Y 2101/02* (2013.01); *H05K 2201/1031* (2013.01); *H05K 2203/0228* (2013.01); *H05K 2203/1316* (2013.01); *H05K 2201/037* (2013.01); *H05K 2201/10106* (2013.01)

(56) References Cited

U.S. PATENT DOCUMENTS

| | | | | |
|---|---|---|---|---|
| 7,926,977 | B2 * | 4/2011 | Nall et al. | 362/249.02 |
| 8,143,631 | B2 * | 3/2012 | Crandell et al. | 257/88 |
| 8,262,250 | B2 * | 9/2012 | Li et al. | 362/219 |
| 2012/0063139 | A1 * | 3/2012 | Benkart et al. | 362/249.02 |
| 2012/0120644 | A1 | 5/2012 | Rieger | |

FOREIGN PATENT DOCUMENTS

| | | | |
|---|---|---|---|
| DE | 102009035369 | A1 | 2/2011 |
| DE | 102009054511 | A1 | 6/2011 |
| WO | 02093992 | A1 | 11/2002 |
| WO | 2010092106 | A1 | 8/2010 |
| WO | 2011069844 | A2 | 6/2011 |

* cited by examiner a)

b)

METHOD OF PRODUCING A LIGHTING DEVICE, AND A CORRESPONDING LIGHTING DEVICE

RELATED APPLICATIONS

The present application claims priority under 35 U.S.C. 119 to Italian Patent Application No. TO2011A000774 filed Aug. 28, 2011 which is incorporated by reference in its entirety herein.

FIELD OF THE DISCLOSURE

Various embodiments refer to a lighting device comprising a series of LED modules mounted on a flexible printed circuit.

BACKGROUND

A wide range of lighting devices is known in the art. Some of these lighting devices comprise a string of lighting modules, such as a series of LED (light emitting diode) modules mounted on corresponding printed circuit boards (PCBs), such as flexible printed circuits. Persons skilled in the art will understand that the various LED modules of a string of LED modules are typically connected to each other by means of interconnecting links ("jumpers").

Additionally, these lighting devices may be sealed for applications in exterior environments. In particular, these devices are typically classified according to the IP (International Protection) classification of the degree of protection, in which the IP code specified in the EN 60529 standard identifies the degree of protection of the casings of the devices against penetration by solid or liquid external agents. For example, lighting devices for exterior use are typically classified in one of the classes IP65 (casing protected against water jets) and IP68 (casing protected against the effects of submersion).

This IP protection can be provided, for example, by means of a potting process in which the device is filled with a solid substance, such as a resin or thermoplastic material. Alternatively, the device can be covered with the protective material (coating) or the protective material can be extruded directly around the device, by a process called co-extrusion. Persons skilled in the art will understand that transparent protective materials, such as silicone, PVC (polyvinyl chloride), polyurethane, and the like are commonly used in the lighting industry.

For example, when producing a lighting device comprising a series of LED modules, it is possible to use a co-extrusion process in which the protective material is applied directly to a string of LED modules having a theoretically infinite length. This string of LED modules is then cut to create strings of LED modules of predetermined lengths, for example strings having lengths varying from 10 to 50 m. Finally, interconnection connectors are applied to the string of LEDs, for example to the first and/or to the last LED module of the string of LEDs.

However, this production process has a number of drawbacks. For example, in order to mount the interconnection connector, the protective material must be partially removed and the interconnection connector must be fixed, by soldering for example, to the printed circuit of one of the LED modules.

In order to avoid this problem, it is possible to apply the protective material only to strings of LEDs which already include interconnection connectors. However, this production process has the drawback that the co-extrusion process is less efficient, because each string of LEDs has to be manufactured independently.

SUMMARY

Various embodiments provide a solution which overcomes the drawbacks outlined above.

In various embodiments, the interconnecting link which is used is a metal interconnecting element which comprises a hollow portion, in such a way that it forms at least one female connector when the connector is cut.

Thus, when the string (which has been covered with the protective material) is cut into strings of predetermined length, the interconnecting element serves as an interconnecting link between the various LED modules and as an interconnection connector for the first and/or the last LED module.

Preferably, the interconnecting element has a transverse plane of symmetry, such that two female connectors are created when the interconnecting element is cut along this transverse plane of symmetry.

For example, in various embodiments, this interconnecting element is made by plastic deformation of a metal sheet. Alternatively, the interconnecting element can have a tubular shape, being for example an extrusion with a rectangular cross section.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings. In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following description illustrates various specific details intended to provide a deeper understanding of the embodiments. The embodiments may be produced without one or more of the specific details, or may use other methods, components, materials, etc. In other cases, known structures, materials or operations are not shown or described in detail, in order to avoid obscuring various aspects of the embodiments.

The reference to "an embodiment" in this description is intended to indicate that a particular configuration, structure or characteristic described in relation to the embodiment is included in at least one embodiment. Therefore, phrases such as "in an embodiment", which may be present in various parts of this description, do not necessarily refer to the same embodiment. Furthermore, specific formations, structures or characteristics may be combined in a suitable way in one or more embodiments.

The references used herein are purely for convenience and therefore do not define the scope of protection or the extent of the embodiments.

Figure 1:
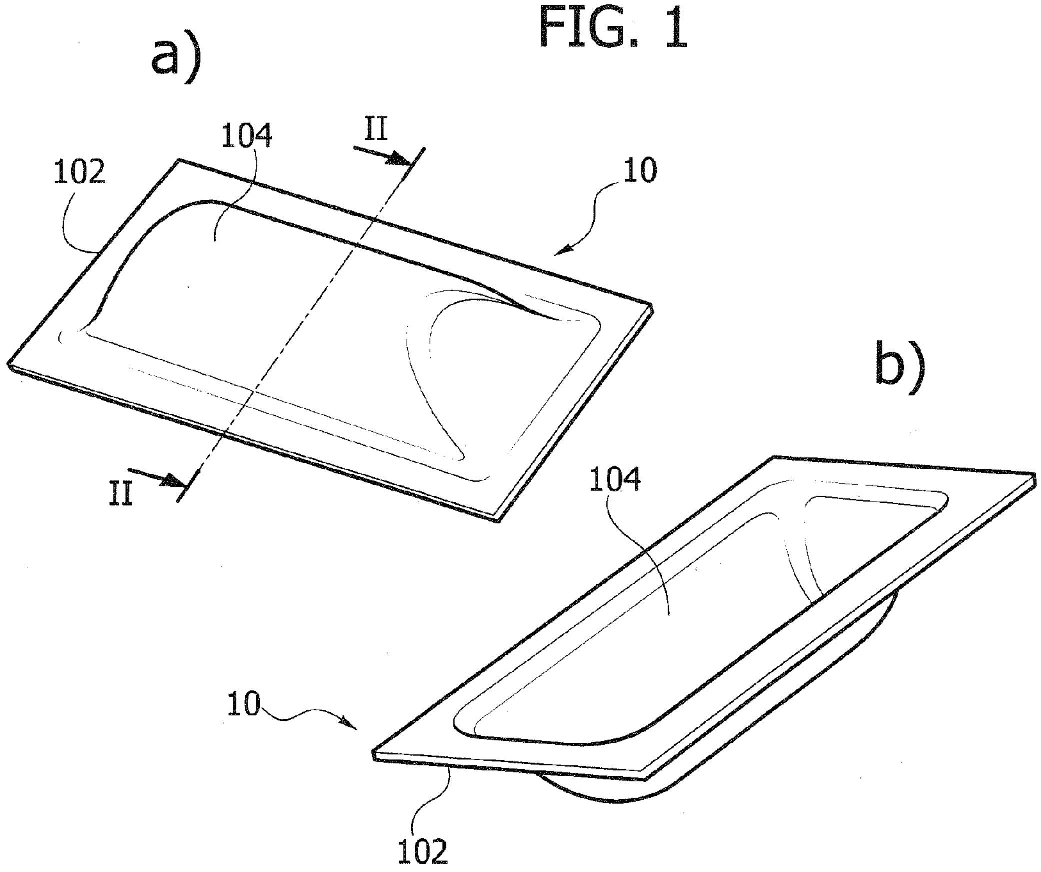
FIGS. 1*a* and 1*b* are perspective views of an embodiment of an interconnecting element.
Figure 2:
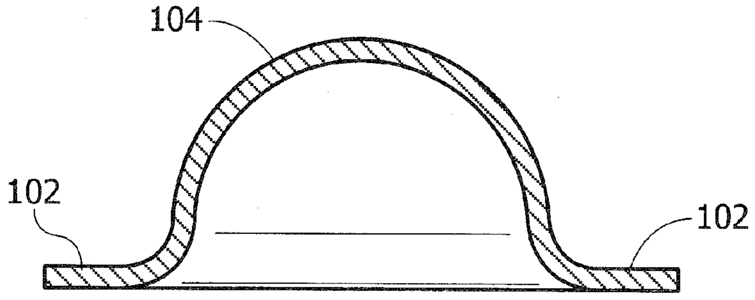
FIG. 2 is a sectional view of an embodiment of the interconnecting element taken through the plane II-II of FIG. 1*a;*

As mentioned previously, the interconnecting link between two LED modules is not a simple jumper, such as a metal pin, but a metal interconnecting element comprising a hollow portion. For example, FIGS. 1*a*, 1*b* and 2 are views of a possible embodiment of an interconnecting element 10 of this type. In particular, FIG. 1*a* is a perspective view from above, FIG. 1*b* is a perspective view from below, and FIG. 2 is a view taken through the plane II-II of FIG. 1*a*. In the embodiment considered here, the interconnecting element 10 has a cup shape with wings; in other words, the interconnecting element 10 comprises a base plate 102 and a hollow portion 104.

In particular, in the embodiment in question, the interconnecting element 10 is symmetrical about the plane II-II, in other words the plane which corresponds to the transverse axis. Thus two identical parts are created when the interconnecting element 10 is cut in two along the transverse axis. The cross section at the plane of symmetry II-II (see FIG. 2) therefore comprises two wings 102 and a concave portion 104.

For example, an interconnecting element 10 of this type can be produced by plastic deformation of a metal plate, such as a copper plate.

In various embodiments, the base plate 102 is used to fix the connection element to two LED modules, by soldering for example, while the hollow portion 104 creates a female connector when the interconnecting element 10 is cut in two.

As an alternative to the embodiment described above, it would also be possible to use an interconnecting element 10 of tubular shape, for example an extrusion with a rectangular cross section. In this case, one of the sides could be used as a base plate 102 and the other three sides would correspond to the hollow portion 104.

Figure 3:
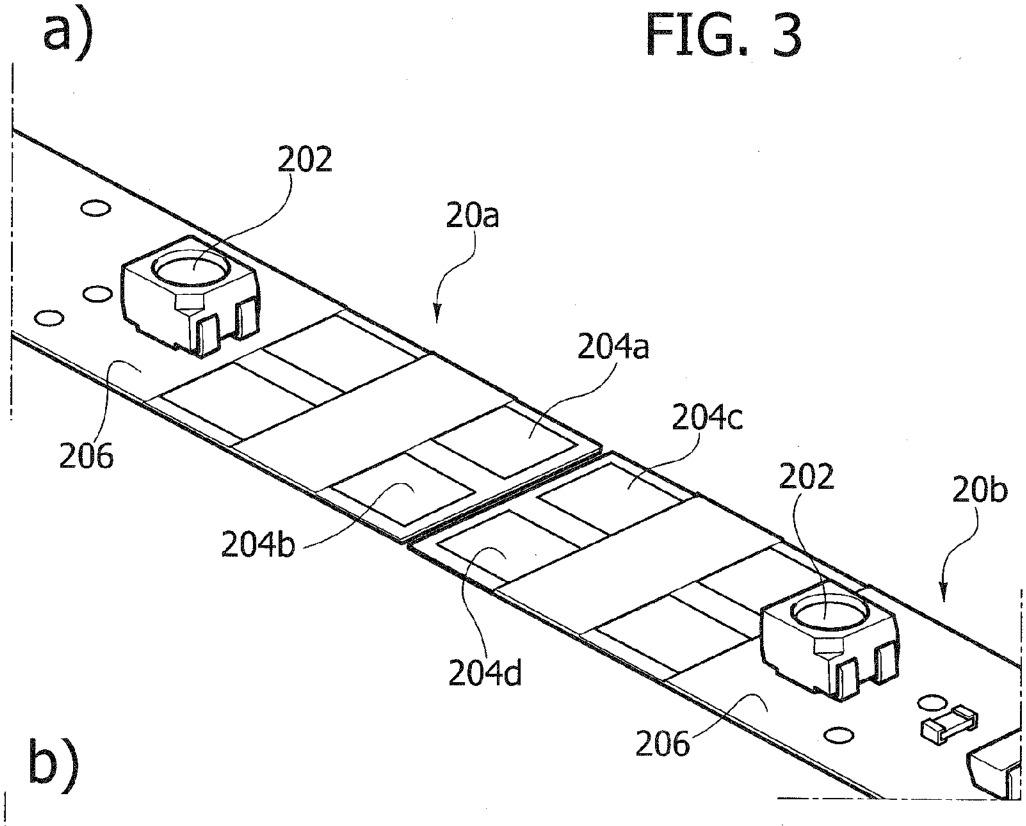
FIGS. 3*a* and 3*b* are perspective views of an embodiment of a string of LEDs with and without the interconnecting element of FIG. 1, respectively.
Figure 3:
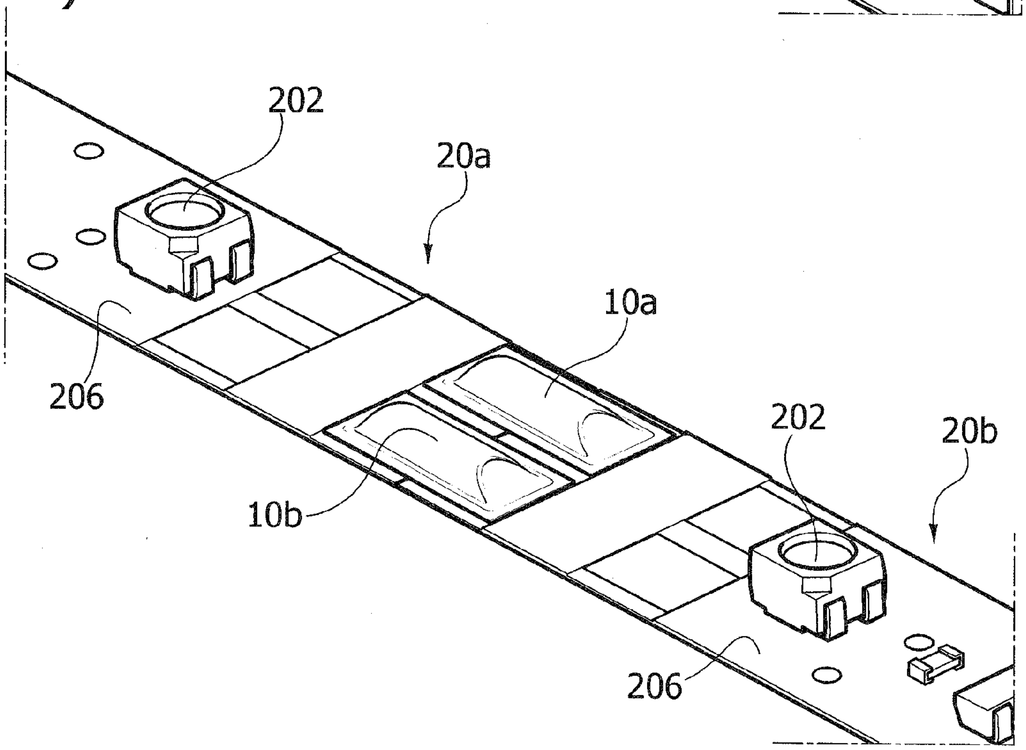

FIGS. 3*a* and 3*b* show the mounting of the interconnecting element on two lighting modules 20*a* and 20*b* in this context.

In the embodiment considered here, the lighting modules 20*a* and 20*b* are identical, and each of the lighting modules 20*a* and 20*b* comprises at least one light source 202, such as an LED, and at least four metal contacts 204*a*, 204*b*, 204*c* and 204*d*. In particular, half of these contacts, for example the contacts 204*a* and 204*b*, are placed at one end of the lighting module 20, and the other half of the contacts, for example the contacts 204*c* and 204*d*, are placed in corresponding positions at the other end of the lighting module 20. For example, in the embodiment considered here, all the contacts and the LEDs are placed on the same side of a printed circuit 206.

Thus the interconnecting element 10 can be used as an interconnecting link for the purpose of always connecting two contacts to each other. For example, in the embodiment considered here, a first interconnecting element 10*a* is used to connect the contacts 204*a* and 204*c*, and a second interconnecting element 10*b* is used to connect the contacts 204*b* and 204*d*.

Figure 4:
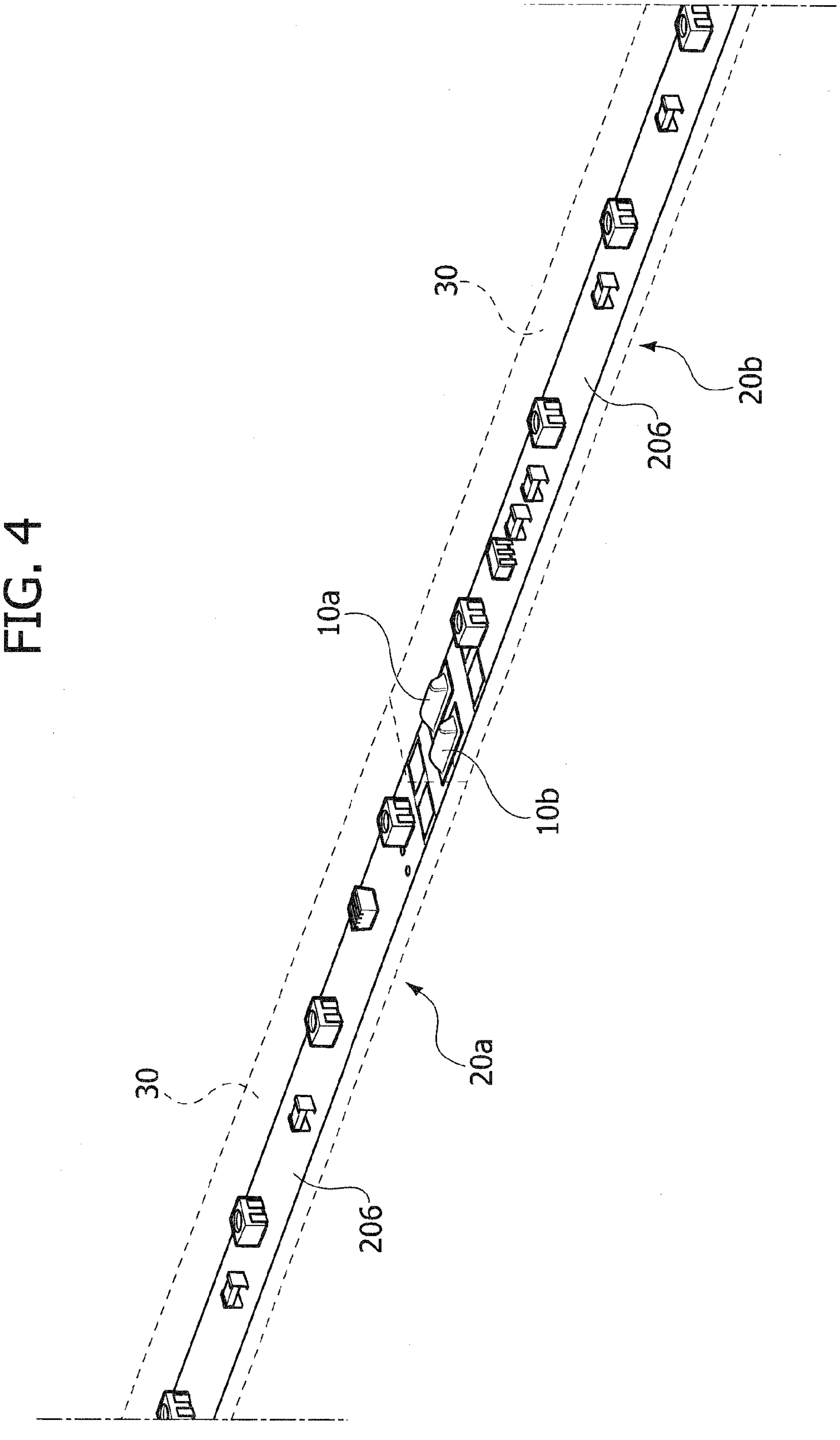
FIG. 4 is a perspective view of an embodiment of a string of LEDs with a protective material applied to it.

The protective material is then applied to the string of LEDs. For example, FIG. 4 is a perspective view of the string of LEDs in which a transparent protective material 30 has been applied to the string of LEDs by a co-extrusion process.

Figure 5:
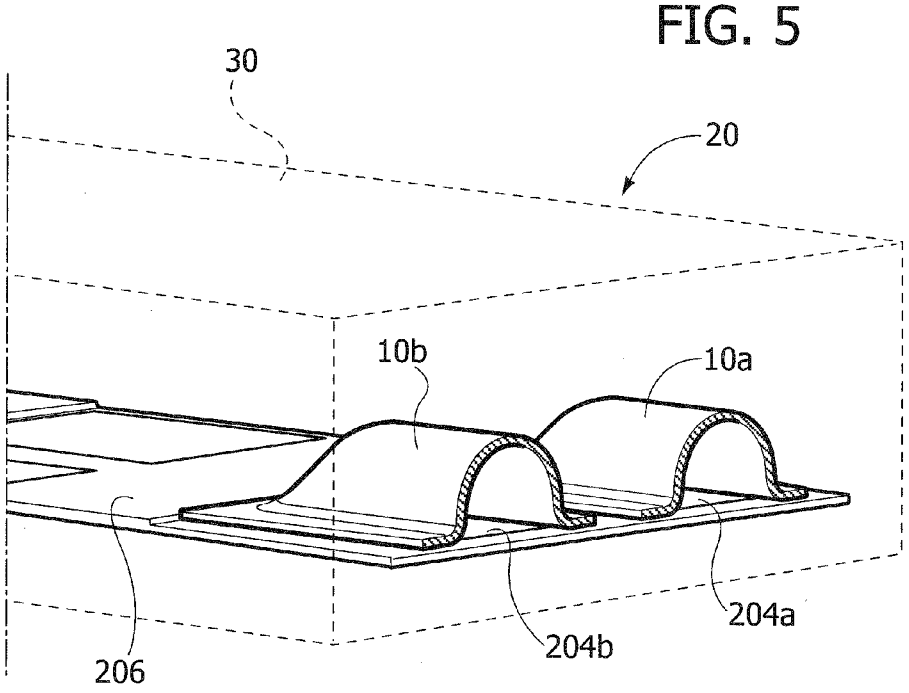
FIG. 5 is a perspective view of the last LED module after the operation of separation of the string of LEDs.

Finally, the string of LEDs can be cut, for example exactly along the transverse axes of the interconnecting elements 10*a* and 10*b*, into strings of LEDs having predetermined lengths. In particular, FIG. 5 is a perspective view of a terminal portion of the cut string of LEDs in which the interconnecting elements 10*a* and 10*b* have been divided into halves. FIG. 5 also shows that the shape of the interconnecting element is such that the cavity within the interconnecting element remains free of the protective material. This portion of the interconnecting element can therefore be used as a female connector.

Figure 6:
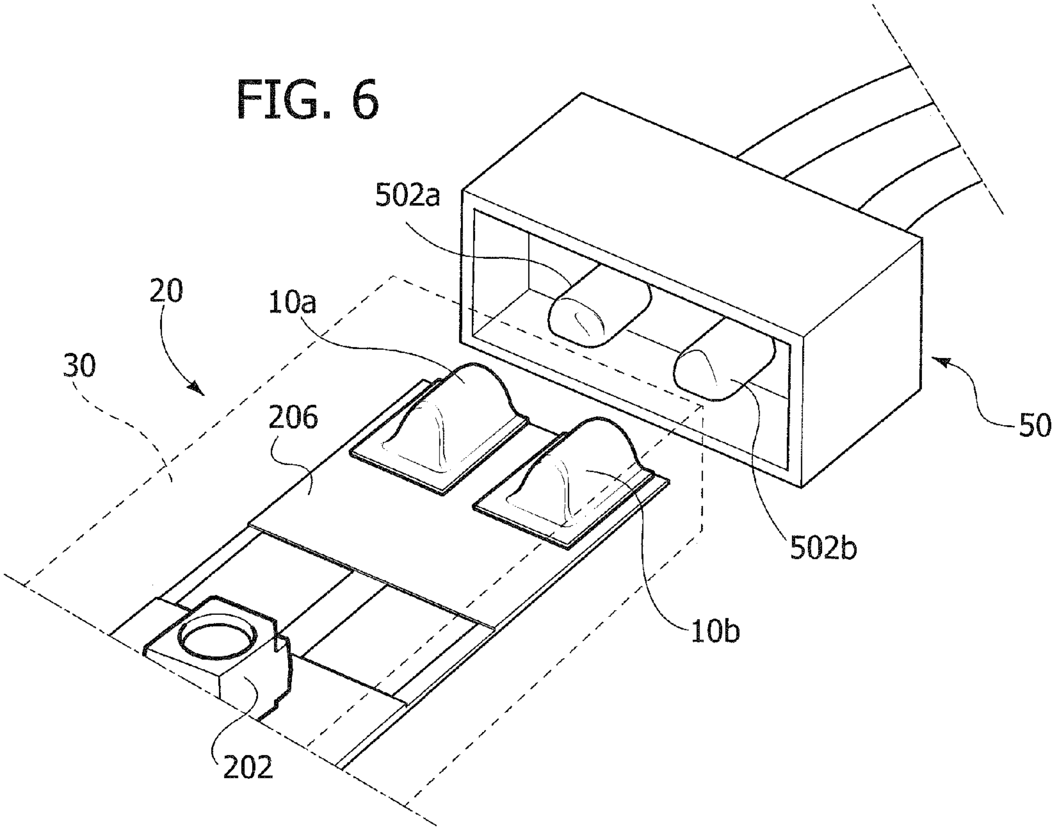
FIG. 6 is a perspective view showing the connection of the last LED module to a male connector.

For example, FIG. 6 shows that the portions of the interconnecting elements 10*a* and 10*b* can be interfaced with a corresponding male connector 50. For example, in the embodiment considered here, this connector 50 comprises two pins 502*a* and 502*b*, which are placed so as to correspond with the interconnecting elements 10*a* and 10*b*.

Figure 7:
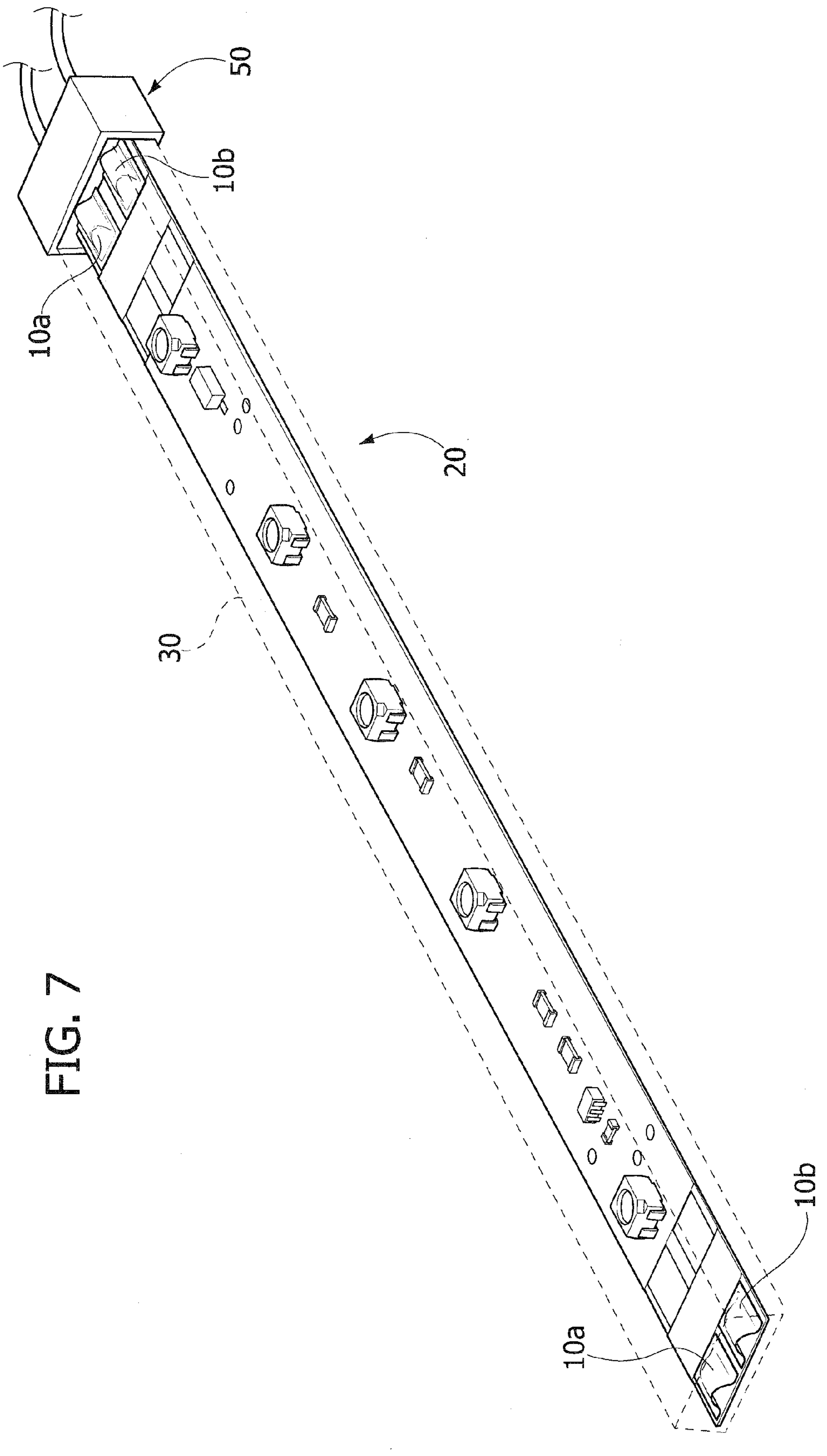
FIG. 7 is a perspective view showing the complete lighting device.

FIG. 7 shows a perspective view of a complete lighting device in this context.

Persons skilled in the art will appreciate that the solution described above has numerous advantages, for example:

- no special manufacturing procedures are required for the application of the interconnection connector; for example, there is no need to remove the protective material in order to fix the interconnection connector;
- the process used for applying the protective material can be carried out continuously;
- the interconnecting element can be produced easily and at low cost;
- the shape of the interconnecting element can be customized;
- the interconnecting element can be fixed to the LED modules by automatic or manual soldering; and
- no other additional links are required for connecting various LED modules of a string of LEDs.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced

What is claimed is:

1. A method for manufacturing lighting devices comprising at least one lighting module, the method comprising: providing a plurality of lighting modules, wherein each lighting module comprises a first set of contacts placed at a first end of said lighting module and a second set of contacts placed in corresponding positions at a second end of said lighting module; connecting together a plurality of said lighting modules for forming a series of lighting modules, wherein each lighting module is connected to the next lighting module by means of interconnection elements which connect the first set of contacts of each lighting module to the second set of contacts of the next lighting module; and cutting said series of lighting modules into lighting devices comprising at least one lighting module, wherein the interconnection elements of the last lighting module of each lighting device are cut along their transverse axes, wherein said interconnection elements comprise a base plate and a hollow portion in order to form female connectors when said interconnection elements are cut along their transverse axis, wherein said interconnection element has a cup shape with wings extending away from the cup shape.

2. The method as claimed in claim 1, comprising the application of a protective material to said series of lighting modules before said series is cut in lighting devices comprising at least one lighting module.

3. The method as claimed in claim 2, wherein said protective material is applied to said series of lighting modules by a potting, coating or co-extrusion process.

4. The method as claimed in claim 2, wherein said protective material is a transparent material.

5. The method as claimed in claim 1, wherein said interconnection element has a tubular shape.

6. The method as claimed in claim 1, wherein said interconnection element is symmetrical with respect to a transverse plane of symmetry.

7. The method as claimed in claim 1, wherein said lighting modules are LED modules comprising at least one light emitting diode.

8. A lighting device comprising a plurality of lighting modules, wherein each lighting module comprises a first set of contacts placed at a first end of said lighting module and a second set of contacts placed in corresponding positions at a second end of said lighting module, wherein said lighting modules are connected in series, each lighting module being connected to the next lighting module by interconnecting elements which connect the first set of contacts of each lighting module to the second set of contacts of the next lighting module, and wherein each interconnecting element comprises a base plate and a hollow portion, and the last lighting module of said lighting device comprises interconnecting elements which have been cut along their transverse axes to form female connectors, wherein said interconnecting elements have a cup shape with wings extending away from the cup shape.

* * * * *